(12) United States Patent
Dreyer et al.

(10) Patent No.: US 6,539,819 B1
(45) Date of Patent: Apr. 1, 2003

(54) SENSOR WITH MOISTURE PROTECTION

(75) Inventors: Volker Dreyer, Lörrach (DE); Jutta Kuhny, Efringen-Kirchen (DE)

(73) Assignee: Endress + Hauser GmbH + Co., Maulburg (DE)

( * ) Notice: Subject to any disclaimer, the term of this patent is extended or adjusted under 35 U.S.C. 154(b) by 0 days.

(21) Appl. No.: 09/379,449

(22) Filed: Aug. 23, 1999

(30) Foreign Application Priority Data

Sep. 2, 1998 (EP) .............................................. 98116545

(51) Int. Cl.⁷ .................................................. G01D 7/00
(52) U.S. Cl. ........................................ 73/866.1; 73/431
(58) Field of Search ................................ 73/866.1, 431, 73/866.5

(56) References Cited

U.S. PATENT DOCUMENTS

| 5,379,267 A | * | 1/1995 | Sparks et al. ............... 367/18 |
| 5,546,804 A | * | 8/1996 | Johnson et al. ................ 73/431 |
| 5,825,303 A | * | 10/1998 | Bloss, Jr. et al. ........ 340/870.02 |
| 6,094,996 A | * | 1/2000 | Campbell et al. .......... 73/862.74 |
| 6,062,095 A | * | 5/2000 | Mulrooney et al. .......... 73/866.5 |

FOREIGN PATENT DOCUMENTS

| DE | 44 18 569 | 11/1995 |
| EP | 0 766 073 | 4/1997 |
| JP | 02285699 | 11/1990 |

* cited by examiner

Primary Examiner—Daniel S. Larkin
Assistant Examiner—Nashmiya Fayyaz
(74) Attorney, Agent, or Firm—Bose McKinney & Evans LLP

(57) ABSTRACT

A sensor which includes a sensor section and an electronics section. The sensor section includes a sensor element. The electronics section includes a insert containing electronics. A passageway extends between the sensor section and the electronics section, through which the electronics section is connected to the sensor section. A connection element for the electrical connection of the sensor element of the sensor section to the electronics of the electronics section, which is an integral part of the insert, extends into and seals the passageway. With a sensor in accordance with the present invention, the sensor element is permanently protected against moisture.

5 Claims, 2 Drawing Sheets

SENSOR WITH MOISTURE PROTECTION

FIELD OF THE INVENTION

The invention relates to a sensor which includes a sensor section having a sensor element, and an electronics section having a insert containing electronics, wherein the sensor section is protected against environmental conditions.

BACKGROUND OF THE INVENTION

Sensors form the basis of industrial measuring and control engineering. For this reason they are used in virtually all facilities in the large industry sector, e.g., in chemistry, in the food industry and in water processing plants. These sensors are used on site to measure and/or monitor process quantities such as pressure, temperature, fluid level, flow or other quantities to be measured. The sensors are placed at a measuring point and contain a sensor element which registers the desired process quantity and changes it into an electric value. The electric value is sent to an electronic device, which further processes and converts this information into an electric output signal, which makes possible a display and/or the regulation of the measurement result.

A sensor typically includes a sensor section having a sensor element, and an electronics section having electronics. The electronics section must have an opening through which the electronics can be positioned, and the electronics in the electronics section must be connectable to the sensor element in the sensor section.

Sensors are regularly exposed to changing environmental conditions, above all else fluctuations in temperature, creating a danger that moisture can penetrate the device, which can greatly impair the function of the sensor element and/or the electronics.

Moisture penetrates, for example, if warm air with high humidity penetrates the sensor section and/or the electronics section and cools down. Upon cooling, the moisture contained in the air condenses and the accumulated water can no longer escape, or only escape very slowly from inside of the sensor.

In addition, moisture can penetrate if there is a temperature gradient between the inside of the sensor and its surroundings and the temperature falls below the dew point inside of the sensor. In this case, condensation also builds up on the inside of the sensor. The water trapped inside can no longer escape, or only escapes very slowly from inside of the sensor.

One objective of the present invention is to provide a sensor in which the sensor element is permanently protected against moisture.

SUMMARY OF THE INVENTION

A sensor of the present invention includes
a sensor section which includes a sensor element,
an electronics section which includes a insert containing electronics,
a passageway between the sensor section and the electronics section, through which the electronics section is connected to the sensor section, and
a connection element which connects the electrical connection of the sensor element to the electronics, the connection element
being an integral component of the insert,
extending into the passageway, and
sealing the passageway.

In accordance with one preferred embodiment of the invention, the hollow sections inside of the insert and inside the connection element integrated with the insert are filled with a filling material.

In accordance with another preferred embodiment of the invention, there is a seal between the passageway and the connection element.

In accordance with another preferred embodiment of the invention, an air filter is fitted in an exterior wall of the electronics section.

In accordance with another preferred embodiment of the invention, the electronics section is sealed with a removable cover.

The sensor of the present invention offers the advantage that, despite the necessary passageway between the sensor section and the electronics section, the interior is divided into two separate sections. Therefore the volume of the hollow section, which can act as an air absorbing pump volume if the temperature changes, is practically restricted to the free volume remaining in the electronics section. Moisture can therefore only penetrate the electronics section from outside, if at all. The sensor section is sealed and there is practically no exchange of air between the sensor section and the electronics section.

Another advantage of the sensor of the present invention is that it is modular. The electronics and sensor element are separate components which can be used independent of one another and are only linked via the connection element. The sensor can therefore be manufactured at little expense and offers a high degree of flexibility. For example, there could be a kit of various electronics and different types of sensor elements, which can be combined in any number of ways.

BRIEF DESCRIPTION OF THE DRAWING

Further features and advantages of the present invention will now be explained in the following description of an example embodiment with reference to the figures, in which.

DETAILED DESCRIPTION OF THE INVENTION

Figure 1:
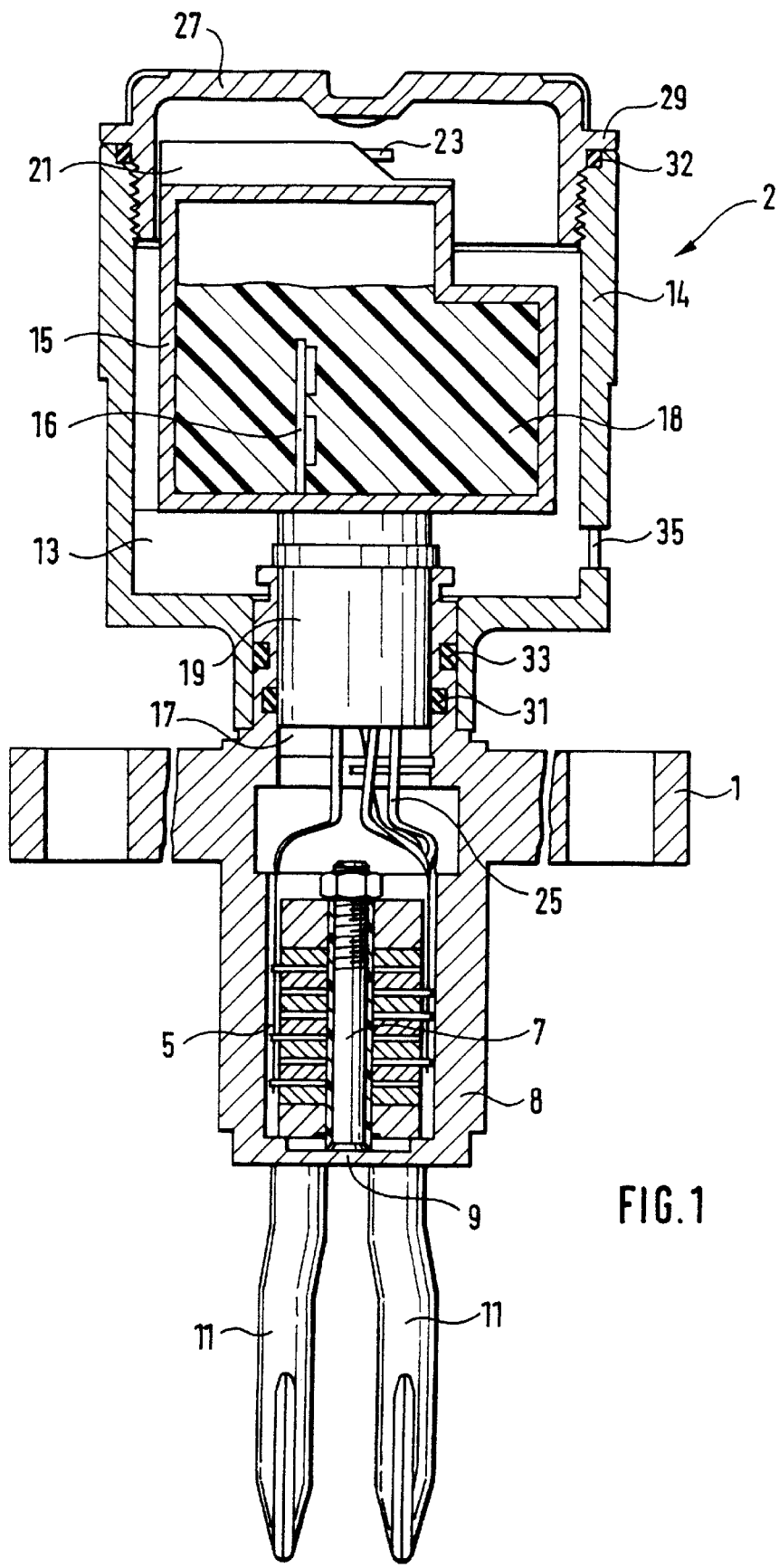
FIG. 1 shows a cross section of the sensor with a flange for mounting.
Figure 2:
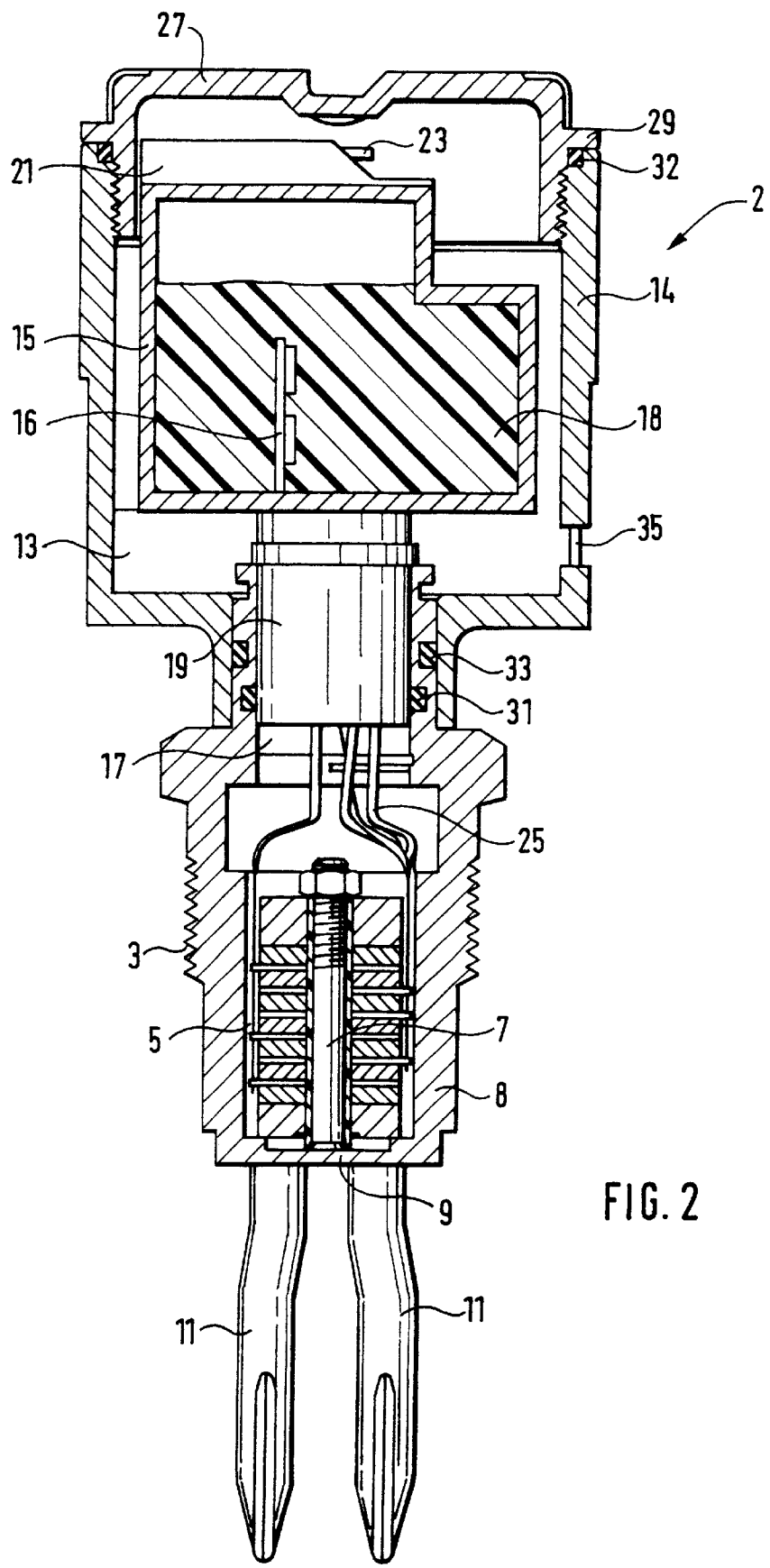
FIG. 2 shows a cross section of the sensor with a screw mounting.

FIGS. 1 and 2 show a sensor 2 in accordance with the present invention. The sensor 2 is to be mounted at a measuring point. For this purpose, the sensor 2 shown in FIG. 1 includes a flange 1 with which the sensor 2 can be mounted to another flange on, for example, a tank or a receptacle. Alternatively, the sensor 2 shown in FIG. 2 includes an outer thread 3 by means of which it could be screwed into an opening, for example into a tank or a receptacle.

The sensor 2 has a sensor section 5, which includes a sensor element 7. The sensor element 7 can be, for example, a pressure sensor element, a temperature sensor element, a capacitive fluid level probe, an ultrasonic sensor element, a microwave sending and receiving module, or a flow meter.

In the embodiment shown in the Figures, sensor element 7 includes an electro-mechanical transformer of a fluid level switch. A pot-shaped casing 8 seals the sensor section 5. The bottom of the pot-shaped casing 8 forms a membrane 9, on whose exterior side two vibrating rods 11 are mounted. Membrane 9 is set into vibration by the electro-mechanical transformer of the sensor element 7. Due to the vibrations of the membrane 9, the vibrating rods 11 vibrate vertically along their longitudinal axis.

The electro-mechanical transformer of the sensor element 7 is made up of a stack of piezoelectric elements, of which at least one functions as a transmitter and sets the membrane 9 into vibration and at least one functions as a receiver and receives the vibrations from the membrane 9.

The sensor 2 is mounted onto a receptacle in such a way that the vibrating rods 11 extend into the receptacle to a predetermined contents level, and determine and/or monitor when the contents of the receptacle reach the predetermined contents level. The vibrating qualities of the vibrating structure depend on whether the vibrating rods 11 are covered by the contents of the receptacle or whether they vibrate freely. For example, the frequency, amplitude or duration of the vibration of the vibrating structure following a short-term vibration stimulation can be measured and analyzed. It is also possible to continuously stimulate the vibrating structure to vibrate, for example at its resonance frequency, and to record and analyze the amplitude and/or frequency of this vibration.

In addition to sensor section 5, the sensor 2 also includes an electronics section 13. The electronics section 13 includes an electronics casing 14 and a insert 15. The insert 15 includes electronics 16.

Between sensor section 5 and electronics section 13 there is a passageway 17, through which the electronics section 13 is connected to the sensor section 5.

The invention includes a connection element 19 for the electrical connection of the sensor element 7 to the electronics 16. The connection element 19 is an integral component of the insert 15. The connection element 19 extends into passageway 17 and seals passageway 17.. The outer geometry of the sensor element end of the connection element 19 is the same as the inner geometry of the passageway 17. In this way, the passageway 17 is sealed and the sensor section 5 and the electronics section 13 are separated from each other. There is preferably a gasket 31 between the passageway 17 and the connection element 19.

In the embodiment shown, where the sensor section 5 and the electronics section 13 are contained in two different casings 8 and 14, there is preferably also a gasket 33 between where the pot-shaped casing 8 and the electronics casing 14 meet, or as shown in the Figures, where they overlap. The two casings shown each have a cylindrical section and the two cylindrical sections wrap around each other co-axially. The inner cylindrical section has a circular groove around it, in which the gasket 33 is placed.

The insert 15 and the connection element 19 are preferably a casing made of a single piece of plastic. The insert 15 has an opening on the side facing the connection element 19, through which electronic connections are routed. The electronics 16 are preferably an electronic circuit mounted on one or more circuit boards, and the circuit boards are plugged into sockets inside of the insert 15. Electric contact elements of the sockets produce an electric contact upon the insertion of the circuit boards into the sockets.

On the side of the connection element 19 facing the sensor element 7, there are connections which can be connected to sensor element 7. These connections are, for example, clip plugs, into which the connecting wires 25 of sensor element 7 can be plugged. In the embodiment shown, the connecting wires 25 are wires which are directly connected to the electrodes of the piezoelectric elements of the sensor element 7. Each of the connecting wires 25 is connected to a contact element on the inside of the connection element 19 which is connected to the electronics 16 of the insert 15.

The insert 15 is sealed by a cover 21, preferably a removable cover. There are connectors 23 on the cover 21, each of which is electrically connected to a contact element which is connected to the electronics 16 of the insert 15. The sensor 2 can be supplied with energy through the connectors 23 and the output signal from the sensor 2 can be transmitted through the connectors 23.

The remaining hollow sections inside of the insert 15 and the connection element 19, which is integrated with the insert 15, are preferably filled with a filling material 18, such as a silicone gel.

The electronics casing 14 has an opening through which the insert 15 is positioned during assembly. The opening of the electronics casing 14 is sealed with a removable cover 27. The cover 27 has an outer thread 28 and is screwed into the opening of the electronics casing 14. In addition, the cover 27 has a shoulder 29 extending outwards radially, which when assembled rests on top of a ring surface at the opening of the electronics casing 14. In the ring surface there is a groove for receiving a gasket 32. In the embodiment shown, the gasket 32 is an o-ring made of an elastomer. The opening of the electronics casing 14 is therefore sealed by the outer thread 28 of the cover 27 and by the gasket 32.

The connectors 23 can be accessed through the opened cover 27. There is usually a hermetically sealed passageway, not shown in FIG. 1, through which wires are routed from outside the sensor 2 into the electronics section 13, which are then connected to the connectors 23.

The construction described above ensures that the sensor section 5 is separated from the electronics section 13 and is sealed, preferably hermetically, with the gasket 31. The sensor element 7 is therefore completely protected against moisture.

However, due to the necessary openings in the electronics section 13 it cannot be completely ruled out that moisture could penetrate into the electronics section 13. Although the electronics 16 are protected by the surrounding insert 15 and, if necessary, by the filling compound 18, it is still recommended that the amount of penetrating moisture be kept to a minimum. For this purpose, the sensor 2 preferably includes a waterproof air filter 35 in the outer wall of the electronics casing 14. The waterproof air filter 35 allows air exchange between the interior of the electronics section 13 and its surroundings while simultaneously acting as a water vapor barrier. In this way, the creation of temperature gradients between the interior of the electronics section 13 and its surroundings are significantly reduced and the moisture contained in air penetrating from outside is at least partially blocked.

In addition, pressure equalization is achieved through the air filter 35, which prevents the gasket 32 and the cover 27 of the electronics section 13 from being stressed.

We claim:

1. A sensor comprising:

a sensor section having a sensor element, an electronics section having a insert which includes electronics, a passageway between the sensor section and the electronics section through which the electronics section is connected to the sensor section, and a connection element for the electrical connection of the sensor element to the electronics, comprising at least one socket and connections connected to the sensor element the connection element extending into the passageway and sealing the passageway, the connection element being an integral component of the insert.

2. The sensor of claim 1, wherein hollow sections inside the insert and the connection element are filled with a filling material.

3. The sensor of claim 1, further comprising a gasket between the passageway and the connection element.

4. The sensor of claim 1, wherein an outer wall of the electronics section includes an air filter.

5. The sensor of claim 1, wherein the electronics section is sealed with a removable cover.

* * * * *

UNITED STATES PATENT AND TRADEMARK OFFICE
CERTIFICATE OF CORRECTION

PATENT NO. : 6,539,819 B1
DATED : April 1, 2003
INVENTOR(S) : Volker Dreyer and Jutta Kuhny It is certified that error appears in the above-identified patent and that said Letters Patent is hereby corrected as shown below:

<u>Title page,</u>
Please add the following priority data:
-- [63] Related U.S. Application Data
Provisional application No. 60/107,158, filed on November 4, 1998 --

Signed and Sealed this

Nineteenth Day of August, 2003

JAMES E. ROGAN
*Director of the United States Patent and Trademark Office*